(12) United States Patent
Kim et al.

(10) Patent No.: US 9,006,969 B2
(45) Date of Patent: Apr. 14, 2015

(54) LIGHT EMITTING DISPLAY DEVICE AND METHOD OF FABRICATING THE SAME

(71) Applicant: Samsung Display Co., Ltd., Yongin, Gyeonggi-do (KR)

(72) Inventors: Eui Gyu Kim, Yongin (KR); Young Il Kim, Yongin (KR)

(73) Assignee: Samsung Display Co., Ltd. (KR)

( * ) Notice: Subject to any disclaimer, the term of this patent is extended or adjusted under 35 U.S.C. 154(b) by 147 days.

(21) Appl. No.: 13/945,159

(22) Filed: Jul. 18, 2013

(65) Prior Publication Data
US 2014/0306601 A1    Oct. 16, 2014

(30) Foreign Application Priority Data
Apr. 15, 2013 (KR) .................. 10-2013-0041186

(51) Int. Cl.
| | | |
|---|---|---|
| H01J 1/62 | (2006.01) | |
| H01J 63/04 | (2006.01) | |
| H01L 27/32 | (2006.01) | |
| H01L 51/50 | (2006.01) | |
| H01L 51/00 | (2006.01) | |

(52) U.S. Cl.
CPC ......... *H01L 27/3223* (2013.01); *H01L 51/0031* (2013.01); *H01L 51/50* (2013.01)

(58) Field of Classification Search
CPC .. H01L 27/3223; H01L 51/50; H01L 51/0031
USPC ............. 313/503, 504, 505, 506, 512; 445/24
See application file for complete search history.

(56) References Cited

U.S. PATENT DOCUMENTS

| | | | | |
|---|---|---|---|---|
| 2002/0064966 | A1* | 5/2002 | Seki et al. ................. | 438/780 |
| 2009/0128020 | A1* | 5/2009 | Takei et al. ................ | 313/504 |
| 2009/0309489 | A1* | 12/2009 | Takata et al. .............. | 313/504 |
| 2012/0091441 | A1* | 4/2012 | Matsushima .............. | 257/40 |
| 2012/0091483 | A1* | 4/2012 | Matsushima .............. | 257/89 |
| 2013/0256648 | A1* | 10/2013 | Nakatani ................... | 257/40 |

FOREIGN PATENT DOCUMENTS

| | | |
|---|---|---|
| JP | 2005-339826 | 12/2005 |
| KR | 10-2003-0001343 | 1/2003 |
| KR | 10-2008-0014626 | 2/2008 |

* cited by examiner

*Primary Examiner* — Anh Mai
*Assistant Examiner* — Glenn Zimmerman
(74) *Attorney, Agent, or Firm* — Knobbe Martens Olson & Bear LLP

(57) ABSTRACT

A light emitting display device and a method of fabricating the same are disclosed. The light emitting display device comprises: a substrate comprising an active region in which a plurality of active pixels for displaying images are formed and a first dummy region disposed outside the active region and in which a plurality of first dummy pixels is formed; a first electrode formed on the substrate in each pixel; a pixel defining layer having an opening that exposes the first electrode; a surface treatment layer formed on the first electrode and having a plurality of grooves in each of the first dummy pixels; a light emitting layer formed on the surface treatment layer; and a second electrode formed on the light emitting layer in each of the active pixels.

20 Claims, 23 Drawing Sheets

LIGHT EMITTING DISPLAY DEVICE AND METHOD OF FABRICATING THE SAME

This application claims priority from Korean Patent Application No. 10-2013-0041186 filed on Apr. 15, 2013 in the Korean Intellectual Property Office, the disclosure of which is incorporated herein by reference in its entirety.

BACKGROUND

1. Field

The present disclosure relates to a light emitting display device and a method of fabricating the same.

2. Description of the Related Technology

Of light emitting display devices, organic light emitting display devices, which are self-luminous display devices, are drawing attention as next-generation display devices due to their wide viewing angle, high contrast, and fast response time.

An organic light emitting display device includes an organic light emitting layer formed of an organic material between an anode and a cathode. When positive and negative voltages are respectively applied to these electrodes, holes from the anode move to the organic light emitting layer via a hole injection layer and a hole transport layer, and electrons from the cathode move to the organic light emitting layer via an electron injection layer and an electron transport layer. Then, the holes and the electrons recombine in the organic emitting layer. The recombination of the holes and the electrons generates excitons, and the organic light emitting layer emits light as the excitons change from an excited state to a ground state. As a result, an image is displayed.

The organic light emitting device includes a pixel defining layer having an opening that exposes the anode, and a light emitting layer is formed on the anode exposed through the opening of the pixel defining layer. The light emitting layer may be formed by printing a light emitting material on the anode exposed through the opening of the pixel defining layer by using an inkjet printing method or a nozzle printing method. A lyophilic surface treatment layer may be formed in order to improve the wettability of the light emitting material.

In order to determine whether the lyophilic property of a surface treatment layer satisfies a reference value, the surface treatment layer is typically formed on a small separate substrate, and a contact angle of a light emitting material on the surface treatment layer is measured. If the measured contact angle of the light emitting material on the surface treatment layer is, for example, 10 degrees or less, it is determined that the lyophilic property of the surface treatment layer satisfies the reference value.

However, even if it is determined that the lyophilic property of the surface treatment layer satisfies the reference value, the wettability of the light emitting material can be reduced in a process of fabricating an organic light emitting display device. This indicates that the method of measuring the contact angle of the light emitting material on the surface treatment layer on the small separate substrate fails to reflect a change in the wettability of the light emitting material due to a defect in the surface treatment layer which may occur in the process of fabricating the organic light emitting display device.

SUMMARY OF CERTAIN INVENTIVE ASPECTS

Aspects of the present invention provide a light emitting display device and a method of fabricating the same, in which the quality of a surface treatment layer can be monitored reliably by evaluating the wettability of a light emitting material on the surface treatment layer in a fabrication process.

Aspects of the present invention also provide a light emitting display device and a method of fabricating the same, in which the quality of a surface treatment layer can be monitored reliably by evaluating the breaking of a light emitting material on a top surface of a pixel defining layer in a fabrication process.

However, aspects of the present invention are not restricted to the ones set forth herein. The above and other aspects of the present invention will become more apparent to one of ordinary skill in the art to which the present invention pertains by referencing the detailed description of the present invention given below.

According to an aspect of the present invention, there is a provided light emitting display device comprising: a substrate comprising an active region in which a plurality of active pixels is formed and a first dummy region disposed outside the active region and in which a plurality of first dummy pixels is formed; a first electrode formed on the substrate in each pixel; a pixel defining layer defining each pixel and including an opening configured to expose the first electrode; a surface treatment layer formed on the first electrode and including a plurality of grooves in each of the first dummy pixels; a light emitting layer formed on the surface treatment layer; and a second electrode formed on the light emitting layer in each of the active pixels.

According to another aspect of the present invention, there is provided a method of fabricating a light emitting display device, the method comprising: forming a first electrode on a substrate in each pixel, where the substrate comprises an active region including a plurality of active pixels and a first dummy region disposed outside the active region and including a plurality of first dummy pixels; forming a pixel defining layer on the substrate, the pixel defining layer including an opening exposing the first electrode; forming a surface treatment layer on the first electrode, the surface treatment layer including a plurality of grooves in each of the first dummy pixels; and test-printing a light emitting material by ejecting the light emitting material onto the surface treatment layer in each of the first dummy pixels.

BRIEF DESCRIPTION OF THE DRAWINGS

The above and other aspects and features of the present invention will become more apparent by describing in detail certain embodiments thereof with reference to the attached drawings, in which.

DETAILED DESCRIPTION OF CERTAIN INVENTIVE EMBODIMENTS

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims.

It will also be understood that when a layer is referred to as being "on" another layer or substrate, it can be directly on the other layer or substrate, or intervening layers may also be present. The same reference numbers generally indicate the same components throughout the specification.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Hereinafter, embodiments of the present invention will be described with reference to the attached drawings.

Figure 1:
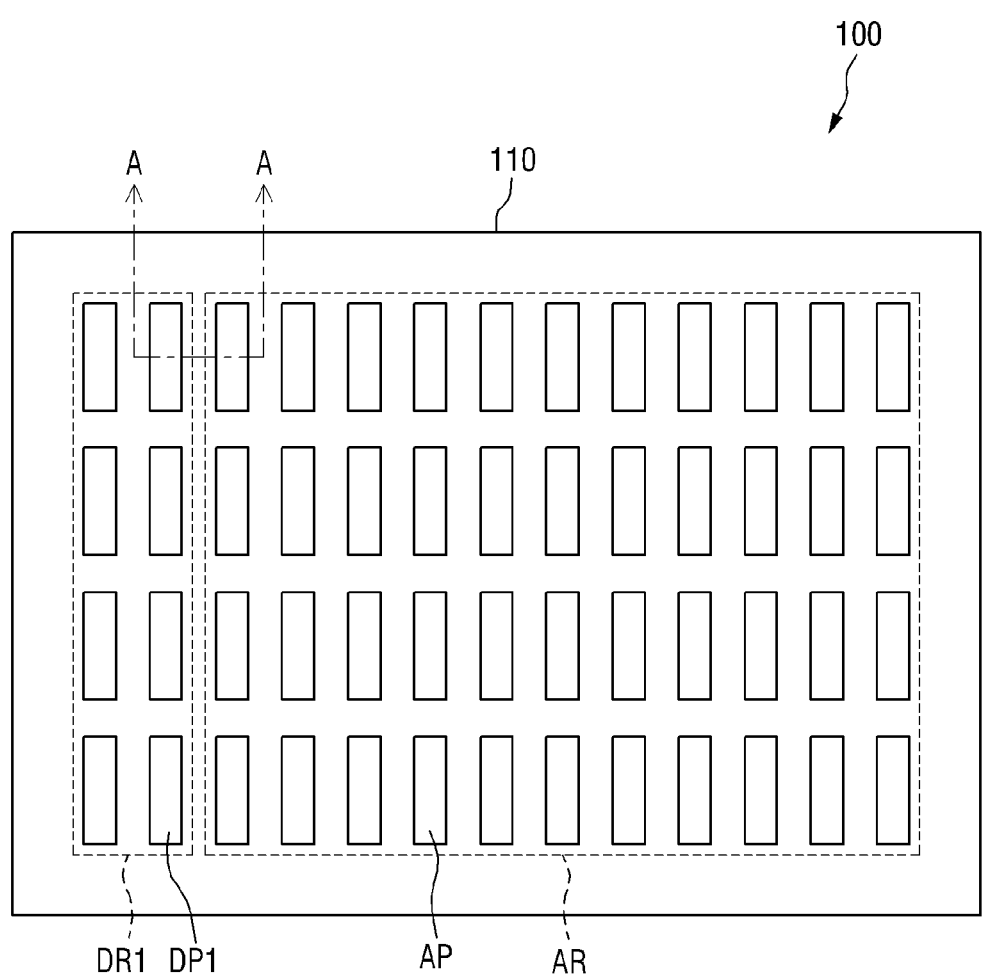
FIG. 1 is a schematic plan view of an active region and a first dummy region of a light emitting display device according to an embodiment of the present invention.
Figure 2:
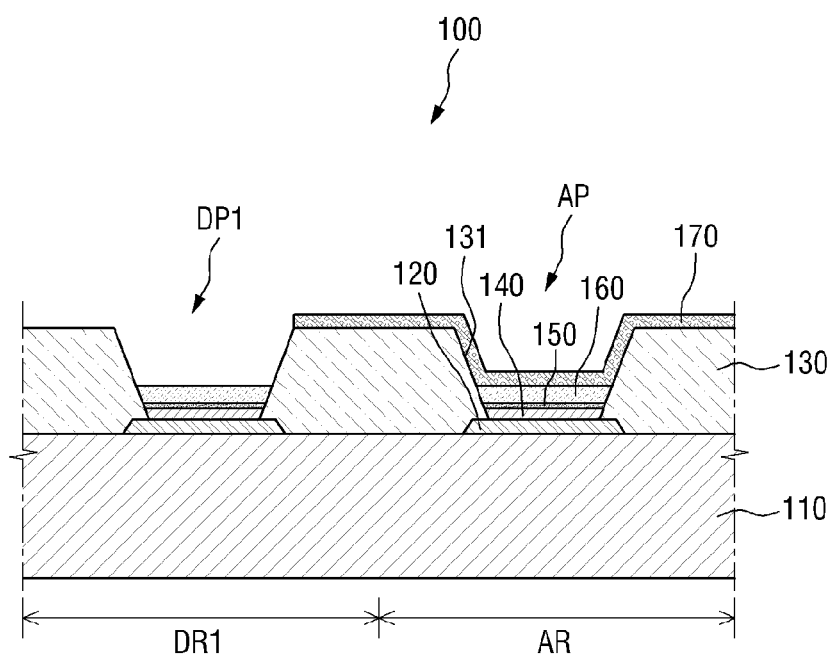
FIG. 2 is a cross-sectional view of the light emitting display device taken along line A-A of FIG. 1.

FIG. 1 is a schematic plan view of an active region and a first dummy region of a light emitting display device according to an embodiment of the present invention. FIG. 2 is a cross-sectional view of the light emitting display device taken along line A-A of FIG. 1.

Referring to FIGS. 1 and 2, the light emitting display device 100 according to one embodiment includes a substrate 110, a first electrode 120, a pixel defining layer 130, a surface treatment layer 150, a light emitting layer 160, and a second electrode 170.

The substrate 110 includes the active region AR and the first dummy region DR1 disposed outside the active region AR. A plurality of active pixels AP for displaying images are formed in the active region AR, and a plurality of first dummy pixels DP1 are formed in the first dummy region DR1.

The substrate 110 may include an insulating substrate. The insulating substrate may be formed of a transparent glass material containing transparent $SiO_2$ as its main component. In some embodiments, the insulating substrate may be formed of an opaque material or a plastic material. Further, the insulating substrate may be a flexible substrate.

Although not shown in the drawings, the substrate 110 may further include other structures formed on the insulating substrate. Examples of the structures may include wirings, electrodes, insulating layers and the like. In some embodiments, the substrate 110 may include a plurality of thin-film transistors (TFTs) formed on the insulating substrate. A drain electrode of each of at least some of the TFTs may be electrically connected to the first electrode 120. Each of the TFTs may include an active area formed of amorphous silicon, polycrystalline silicon, or monocrystalline silicon. In other embodiments, each of the TFTs may include an active area formed of oxide semiconductor, or the like.

The first electrode 120 is formed on the substrate 110 in each pixel. That is, the first electrode 120 is formed in each of the active pixels AP and each of the first dummy pixels DP1. The first electrode 120 may be an anode which provides holes to the light emitting layer 160, or a cathode which provides electrons to the light emitting layer 160 in response to a signal transmitted to the drain electrode of a corresponding TFT. The first electrode 120 may be used as a transparent electrode or a reflective electrode. To be used as a transparent electrode, the first electrode 120 may be formed of indium tin oxide (ITO), indium zinc oxide (IZO), zinc oxide (ZnO), $In_2O_3$, or the like. To be used as a reflective electrode, the first electrode 120 may be formed by forming a reflective layer using Ag, Mg, Al, Pt, Pd, Au, Ni, Nd, Ir, Cr, or the like, or a compound of these materials, and then forming ITO, IZO, ZnO, $In_2O_3$ or the like on the reflective layer.

The pixel defining layer 130 is formed on the substrate 110 to define each pixel, that is, each of the active pixels AP and each of the first dummy pixels DP1 and has an opening 131 that exposes the first electrode 120. Accordingly, the light emitting layer 160 is formed on the first electrode 120 through the opening 131 of the pixel defining layer 130. The pixel defining layer 130 may be formed such that a gap between the active pixels AP is equal to a gap between the first dummy pixels DP1 in one direction.

The light emitting display device 100 according to one embodiment may include a hole injection layer 140 which is formed on the first electrode 120 exposed through the opening 131 of the pixel defining layer 130. If the first electrode 120 is an anode, the hole injection layer 140 may facilitate the injection of holes from the first electrode 120 to the light emitting layer 160. The hole injection layer 140 may be formed of an organic compound such as, but not limited to, 4,4',4"-tris(3-methylphenylphenylamino)triphenylamine (MTDATA), copper phthalocyanine (CuPc), or poly(3,4-ethylenedioxythiophene, polystyrene sulfonate (PEDOT/PSS). The hole injection layer 140 may be formed by, but not limited to, slit coating.

The surface treatment layer 150 is formed on the first electrode 120. The surface treatment layer 150 is formed to have a plurality of grooves in each of the first dummy pixels DP1. In each of the active pixels AP, the surface treatment layer 150 may have the same planar shape as the opening 131 of the pixel defining layer 130. In each of the first dummy pixels DP1, the surface treatment layer 150 may have the same planar shape as the opening 131 of the pixel defining layer 130 but may have a plurality of grooves at edges thereof. The surface treatment layer 150 may be formed by a photolithography process, or the like.

To be lyophilic, the surface treatment layer 150 may be formed of a primer on which a light emitting material of the light emitting layer 160 has a contact angle of about 10 degrees or less. Thus, when the light emitting material of the light emitting layer 160 is printed on the surface treatment layer 150 inside the opening 131 of the pixel defining layer 130 in each of the active pixels AP by using a printing method such as inkjet printing or nozzle printing, the surface treatment layer 150 may enable the light emitting material to have good wettability so that the light emitting layer 160 can be uniformly formed. Good wettability may be interpreted to mean that the liquid is widely spread on the solid surface so that a degree with which the liquid is in contact with a solid surface is high. The inkjet printing method refers to dropping a material to be printed at a desired location in the form of ink droplets, and the nozzle printing method refers to making a material to be printed flow in the form of a solution along a line including a desired location.

The surface treatment layer 150 formed in the first dummy region DR1 may be used to test the wettability of the light emitting material of the light emitting layer 160 when the light emitting material is printed on the surface treatment layer 150 inside the opening 131 of the pixel defining layer 130 in each of the first dummy pixels DP1 by a printing method such as inkjet printing or nozzle printing. Since the surface treatment layer 150 is formed on the first electrode 120 by a photolithography process, it may be over-etched if, for example, an exposure defect occurs. Therefore, the quality of the surface treatment layer 150 may be evaluated by testing the wettability of the light emitting material. The surface treatment layer 150 used to test the wettability of the light emitting material in each of the first dummy pixels DP1 is described below.

The light emitting layer 160 is formed on the surface treatment layer 150. The light emitting layer 160 emits light by recombining holes received from the first electrode 120 and electrons received from the second electrode 170. Holes and electrons injected into the light emitting layer 160 combine together to form excitons, and light is emitted as the excitons change from an excited state to a ground state. The light emitting layer 160 may be formed of an inorganic material such as Se or Zn, or a low molecular or polymer organic material.

Although not shown in the drawings, if the first electrode 120 is an anode and if the second electrode 170 is a cathode, the light emitting display device 100 according to one embodiment may further include a hole transport layer which is formed between the surface treatment layer 150 and the light emitting layer 160 and easily transports holes received from the first electrode 120 to the light emitting layer 160, an electron injection layer which is formed between the light emitting layer 160 and the second electrode 170 and easily injects electrons received from the second electrode 170 into the light emitting layer 160, and an electron transport layer which is formed between the light emitting layer 160 and the electron injection layer and easily transports electrons received from the electron injection layer to the light emitting layer 160.

The second electrode 170 is formed on the light emitting layer 160 in each of the active pixels AP, and may be a cathode which provides electrons to the light emitting layer 160, or may be an anode which provides holes to the light emitting layer 160. Like the first electrode 120, the second electrode 170 may also be used as a transparent electrode or a reflective electrode.

Although not shown in the drawings, the light emitting display device 100 may further include an encapsulation substrate disposed on the second electrode 170. The encapsulation substrate may be an insulating substrate. A spacer may be disposed between the second electrode 170 on the pixel defining layer 130 and the encapsulation substrate. In some embodiments of the present invention, the encapsulation substrate may be omitted. In this case, an encapsulation layer formed of an insulating material may cover the whole structure to protect it.

The surface treatment layer formed in each of the first dummy pixels DP1 is described below.

FIGS. 3 through 9 are plan views illustrating various embodiments of the surface treatment layer formed in each of the first dummy pixels of FIG. 1.

A plurality of grooves (g1-g7) of a surface treatment layer (150, 150a-150f) formed in each of the first dummy pixels DP1 may have any one planar shape selected from a polygon, a semi-circle, a semi-ellipse, and the like, or a combination of these shapes. Since the surface treatment layer (150, 150a-150f) formed in each of the first dummy pixels DP1 has such a shape, it is possible to quantitatively evaluate the wettability of the light emitting material of the light emitting layer 160 when the light emitting material is printed on the surface treatment layer (150, 150a-150f) formed in each of the first dummy pixels DP1.

Figure 3:
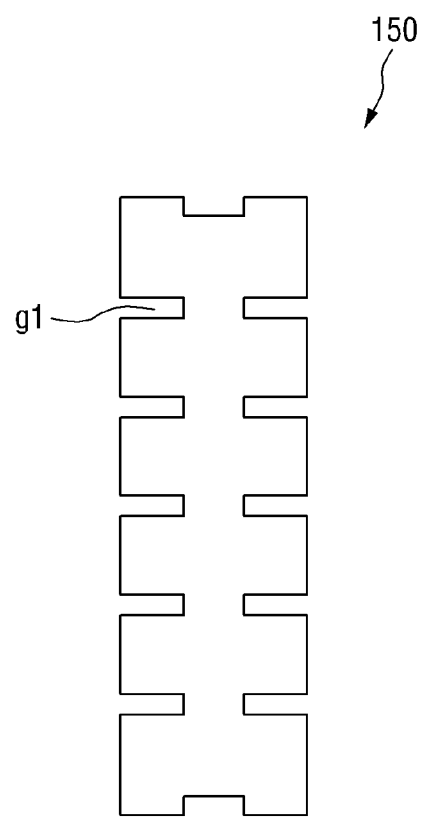
FIGS. 3 through 9 are plan views illustrating various embodiments of a surface treatment layer formed in each of a plurality of first dummy pixels of FIG. 1.

Specifically, referring to FIG. 3, a plurality of grooves g1 having a rectangular planar shape is formed at edges of the surface treatment layer 150 formed in each of the first dummy pixels DP1. Since the surface treatment layer 150 has a shape due to the grooves g1 of the rectangular planar shape, it is possible not only to determine whether the wettability of the light emitting material of the light emitting layer 160 is good or bad when the light emitting material is printed on the surface treatment layer 150 formed in each of the first dummy pixels DP1, but to also quantitatively evaluate the degree of wettability of the light emitting material in each of the first dummy pixels DP1. The quantitative evaluation of the wettability of the light emitting material may refer to evaluating the area which the light emitting material printed on the surface treatment layer 150 formed in each of the first dummy pixels DP1 occupies in each of the first dummy pixels DP1.

More specifically, in the quantitative evaluation of the wettability of the light emitting material, it is evaluated whether the area which the light emitting material printed on the surface treatment layer 150 formed in each of the first dummy pixels DP1 occupies in each of the first dummy pixels DP1 is equal to or greater than a reference area value. The reference area value may be determined to be approximately 50% of the total area of each of the first dummy pixels DP1 in view of the surface treatment layer 150 having a complicated shape.

In the quantitative evaluation of the wettability of the light emitting material, if the area which the light emitting material occupies in each of the first dummy pixels DP1 is equal to or greater than the reference area value, it is determined that the surface treatment layer 150 formed in each of the active pixels AP is not defective. In this case, a process of forming the light emitting layer 160 on the surface treatment layer 150 in each of the active pixels AP may be performed as part of the process of fabricating the light emitting display device 100. On the other hand, if the area which the light emitting material occupies in each of the first dummy pixels DP1 is smaller than the reference area value, it is determined that the surface treatment layer 150 formed in each of the active pixels AP is defective. In this case, the process of fabricating the light emitting display device 100 may be stopped, and the substrate 110 having the evaluated surface treatment layer 150 may be discarded.

Figure 4:
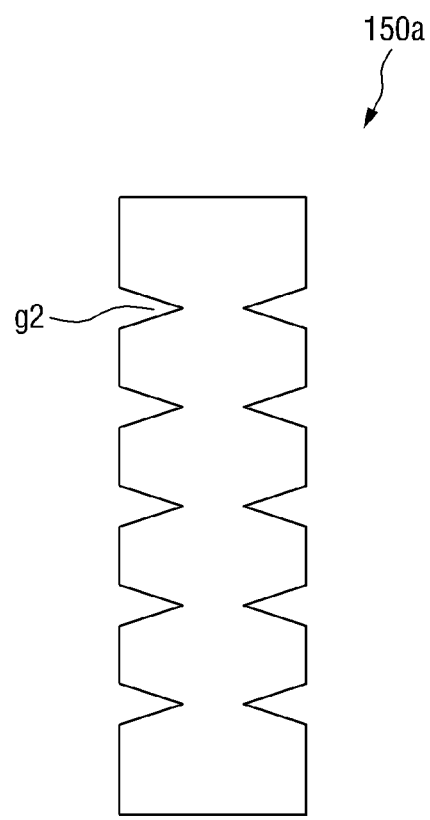

Referring to FIG. 4, a plurality of grooves g2 having an isosceles triangular planar shape is formed at edges of a surface treatment layer 150a formed in each of the first dummy pixels DP1. Since the surface treatment layer 150a has a shape due to the grooves g2 of the isosceles triangular planar shape, it is possible not only to determine whether the wettability of the light emitting material of the light emitting layer 160 is good or bad when the light emitting material is printed on the surface treatment layer 150a formed in each of the first dummy pixels DP1, but to also quantitatively evaluate the degree of wettability of the light emitting material in each of the first dummy pixels DP1.

Figure 5:
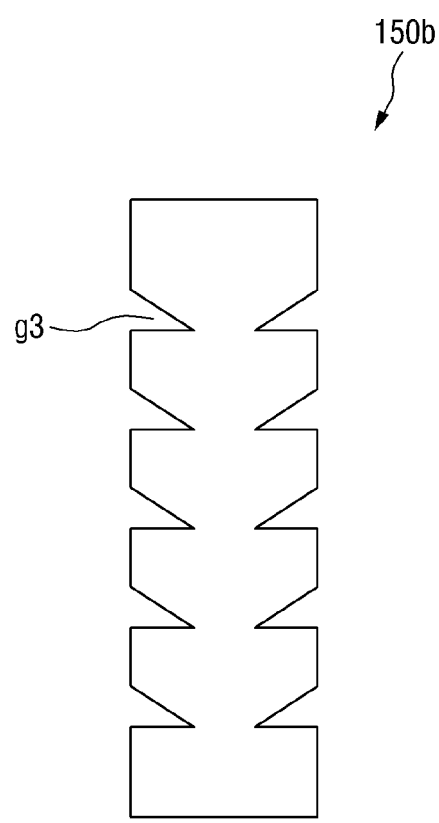

Referring to FIG. 5, a plurality of grooves g3 having a right-angled triangular planar shape is formed at edges of a surface treatment layer 150b formed in each of the first dummy pixels DP1. Since the surface treatment layer 150b has a shape due to the grooves g3 of the right-angled triangular planar shape, it is possible not only to determine whether the wettability of the light emitting material of the light emitting layer 160 is good or bad when the light emitting material is printed on the surface treatment layer 150a formed in each of the first dummy pixels DP1, but to also quantitatively evaluate the degree of wettability of the light emitting material in each of the first dummy pixels DP1.

Figure 6:
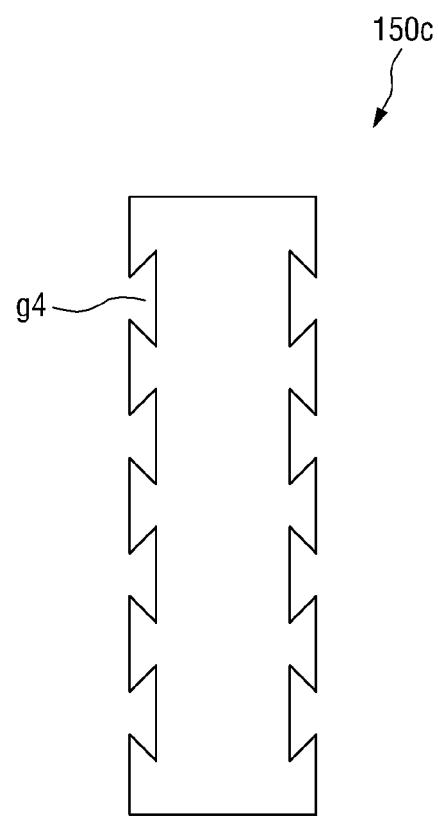

Referring to FIG. 6, a plurality of grooves g4 having a trapezoidal planar shape is formed at edges of a surface treatment layer 150c formed in each of the first dummy pixels DP1. Since the surface treatment layer 150c has a shape due to the grooves g4 of the trapezoidal planar shape, it is possible not only to determine whether the wettability of the light emitting material of the light emitting layer 160 is good or bad when the light emitting material is printed on the surface treatment layer 150c formed in each of the first dummy pixels DP1, but to also quantitatively evaluate the degree of wettability of the light emitting material in each of the first dummy pixels DP1.

Figure 7:
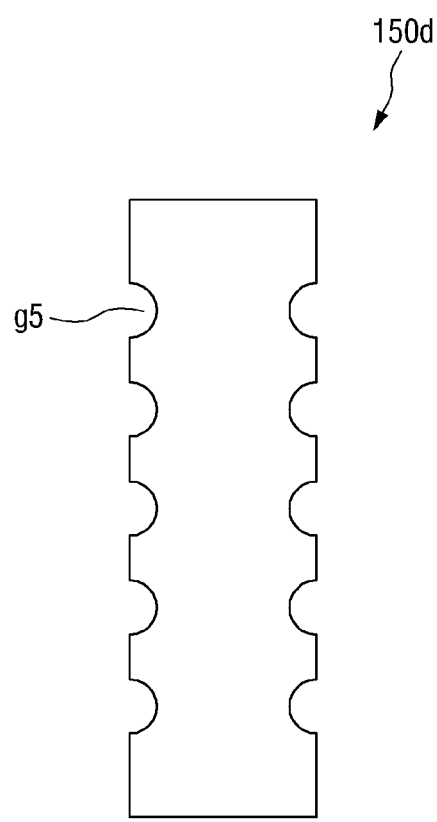

Referring to FIG. 7, a plurality of grooves g5 having a semi-circular planar shape is formed at edges of a surface treatment layer 150d formed in each of the first dummy pixels DP1. Since the surface treatment layer 150d has a shape due to the grooves g5 of the semi-circular planar shape, it is possible not only to determine whether the wettability of the light emitting material of the light emitting layer 160 is good or bad when the light emitting material is printed on the surface treatment layer 150d formed in each of the first dummy pixels DP1, but to also quantitatively evaluate the degree of wettability of the light emitting material in each of the first dummy pixels DP1.

Figure 8:
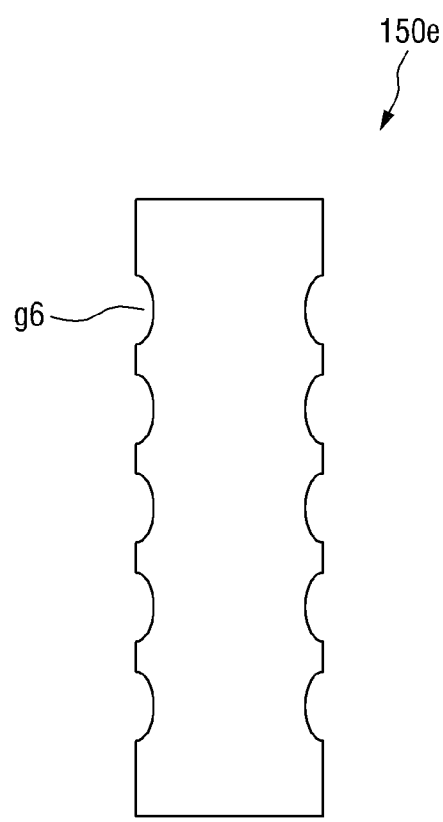

Referring to FIG. 8, a plurality of grooves g6 having a semi-elliptical planar shape is formed at edges of a surface treatment layer 150e formed in each of the first dummy pixels DP1. Since the surface treatment layer 150e has a shape due to the grooves g6 of the semi-elliptical planar shape, it is possible not only to determine whether the wettability of the light emitting material of the light emitting layer 160 is good or bad when the light emitting material is printed on the surface treatment layer 150e formed in each of the first dummy pixels DP1, but to also quantitatively evaluate the degree of wettability of the light emitting material in each of the first dummy pixels DP1.

Figure 9:
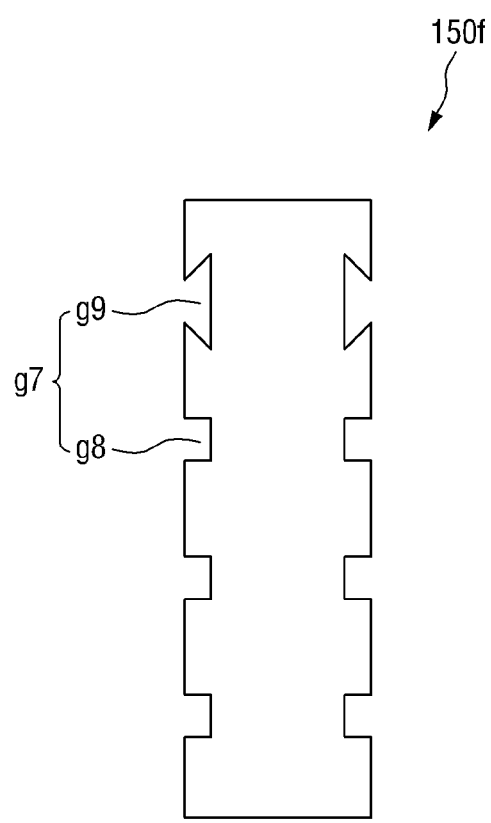

Referring to FIG. 9, a plurality of grooves g7 including a plurality of grooves g8 having a rectangular planar shape and a plurality of grooves g9 having a trapezoidal planar shape are formed at edges of a surface treatment layer 150f formed in each of the first dummy pixels DP1. Since the surface treatment layer 150f has a shape due to the grooves g7 including the grooves g8 of the rectangular planar shape and the grooves g9 of the trapezoidal planar shape, it is possible not only to determine whether the wettability of the light emitting material of the light emitting layer 160 is good or bad when the light emitting material is printed on the surface treatment layer 150f formed in each of the first dummy pixels DP1, but to also quantitatively evaluate the degree of wettability of the light emitting material in each of the first dummy pixels DP1.

As described above, in the light emitting display device 100 according to one embodiment, a surface treatment layer (150, 150a-150f) having a plurality of grooves (g1-g 7) is formed in each of the first dummy pixels DP1. Therefore, when the light emitting material of the light emitting layer 160 is printed on the surface treatment layer (150, 150a-150f) inside the opening 131 of the pixel defining layer 130 by a printing method such as inkjet printing or nozzle printing during the process of fabricating the light emitting display device 100, the wettability of the light emitting material can be quantitatively evaluated.

Hence, in the light emitting display device 100 according to one embodiment, the quality of the surface treatment layer (150, 150a-150f) in the active region AP can be monitored reliably by quantitatively evaluating the wettability of the light emitting material through the surface treatment layer (150, 150a-150f) formed in each of the first dummy pixels DP1.

A light emitting display device according to another embodiment of the present invention will now be described.

Figure 10:
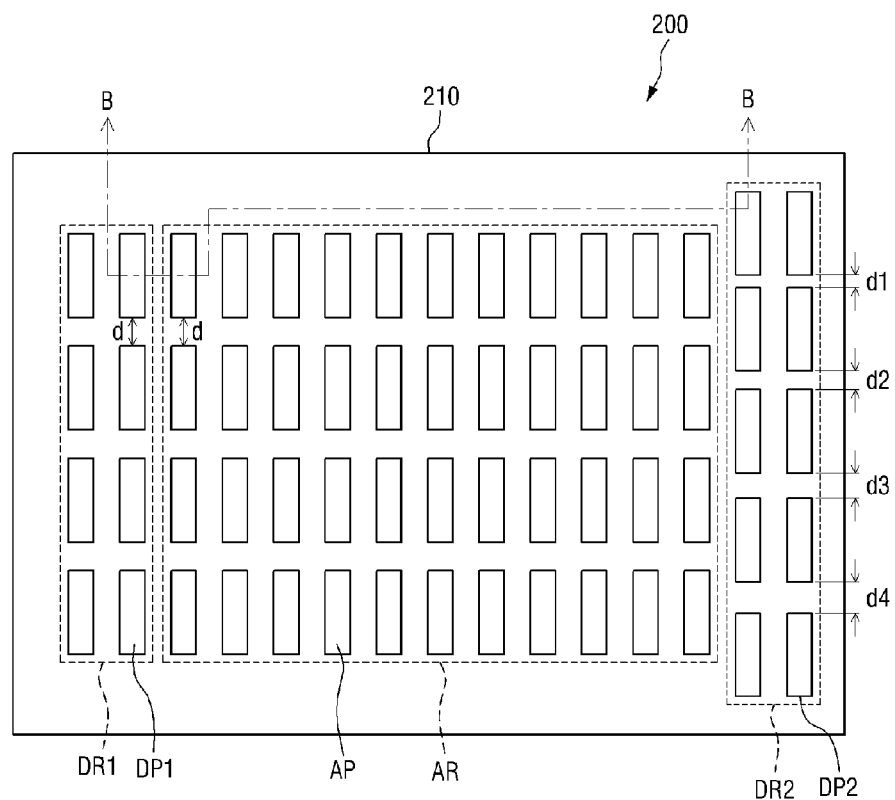
FIG. 10 is a schematic plan view of an active region, a first dummy region and a second dummy region of a light emitting display device according to another embodiment of the present invention.
Figure 11:
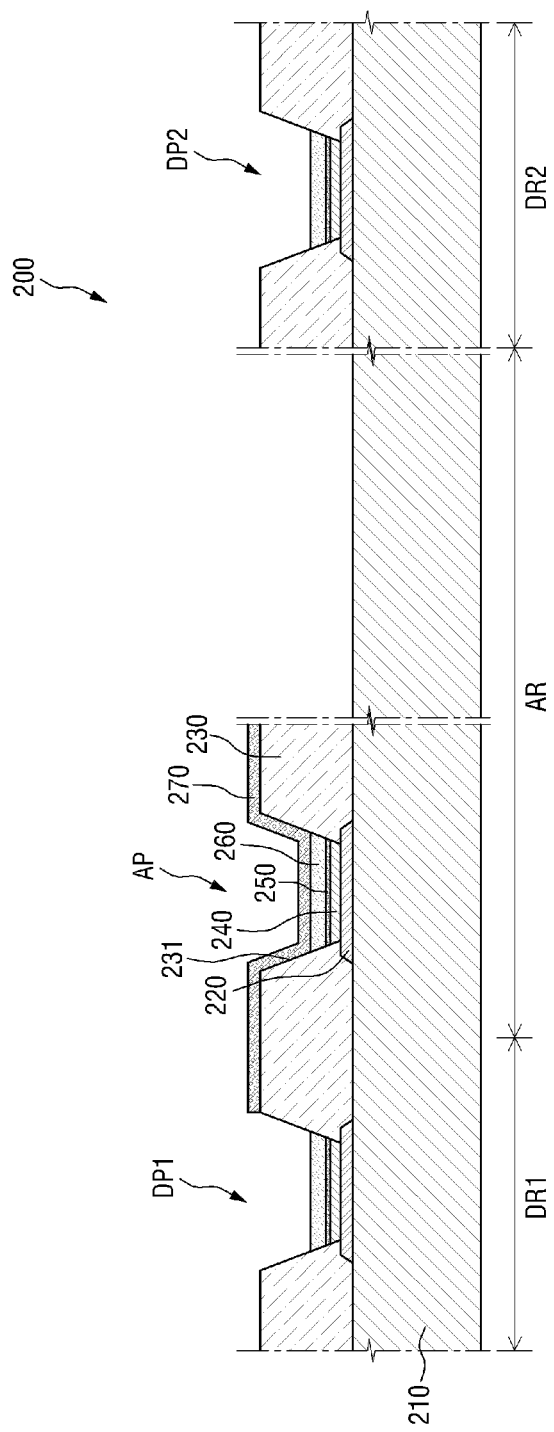
FIG. 11 is a cross-sectional view of the light emitting display device taken along line B-B of FIG. 10.

FIG. 10 is a schematic plan view of an active region, a first dummy region and a second dummy region of a light emitting display device according to another embodiment of the present invention. FIG. 11 is a cross-sectional view of the light emitting display device taken along line B-B of FIG. 10.

Referring to FIGS. 10 and 11, the light emitting display device 200 according to one embodiment includes a substrate 210, a first electrode 220, a pixel defining layer 230, a surface treatment layer 250, a light emitting layer 260, and a second electrode 270.

The substrate 210 is similar to the substrate 110 of FIGS. 1 and 2. However, the substrate 210 includes the active region AR, the first dummy region DP1 disposed outside the active region AR, and the second dummy region DR2 disposed outside the active region AR. A plurality of active pixels AP for displaying images are formed in the active region AR, a plurality of first dummy pixels DP1 are formed in the first dummy region DR1, and a plurality of second dummy pixels DP2 are formed in the second dummy region DR2. A gap d between the first dummy pixels DP1 may be equal to a gap d between the active pixels AP. In addition, a gap between the second dummy pixels DP2 may gradually increase in the order of d1, d2, d3 and d4 and may be equal to or smaller than the gap d between the active pixels AP.

The first electrode 220 is similar to the first electrode 120 of FIG. 2. However, the first electrode 220 is formed on the substrate 210 in each of the active pixels AP, each of the first dummy pixels DP1, and each of the second dummy pixels DP2.

The pixel defining layer 230 is similar to the pixel defining layer 130 of FIG. 2. However, the pixel defining layer 230 defines each of the active pixels AP, each of the first dummy pixels DP1 and each of the second dummy pixels DP2 and has an opening 231 that exposes the first electrode 220. Accordingly, the light emitting layer 260 is formed on the first electrode 220 through the opening 231 of the pixel defining layer 230. The pixel defining layer 230 may be formed such that the gap d between the first dummy pixels DP1 is equal to the gap d between the active pixels AP and that the gap between the second dummy pixels DP2 gradually increases in the order of d1, d2, d3 and d4 but is equal to or smaller than the gap d between the active pixels AP.

The light emitting display device 200 according to one embodiment may include a hole injection layer 240 which is, like the hole injection layer 140 of FIG. 2, formed on the first electrode 220 exposed through the opening 231 of the pixel defining layer 230.

The surface treatment layer 250, like the surface treatment layer 150 of FIG. 2, is formed to have a plurality of grooves in each of the first dummy pixels DP1. In each of the active pixels AP and each of the second dummy pixels DP2, the surface treatment layer 250 may have the same planar shape as the opening 231 of the pixel defining layer 230. However, in each of the first dummy pixels DP1, the surface treatment layer 250 may have the same planar shape as the opening 231 of the pixel defining layer 230 and may have a plurality of grooves. The grooves g1 through g7 shown in FIGS. 3 through 9 may be employed as the grooves of the surface treatment layer 250 formed in each of the first dummy pixels DP1.

Like the surface treatment layer 150 of FIG. 2, the surface treatment layer 250 may be formed of a primer on which a light emitting material of the light emitting layer 260 has a contact angle of about 10 degrees or less. Thus, when the light emitting material of the light emitting layer 260 is printed on the surface treatment layer 250 inside the opening 231 of the pixel defining layer 230 in each of the active pixels AP by using a printing method such as inkjet printing or nozzle printing, the surface treatment layer 250 may improve the wettability of the light emitting material so that the light emitting layer 260 can be uniformly formed.

The surface treatment layer 250 formed in the first dummy region DP1 may be used to test the wettability of the light emitting material of the light emitting layer 260 when the light emitting material is printed on the surface treatment layer 250 inside the opening 231 of the pixel defining layer 230 in each of the first dummy pixels DP1 by a printing method such as inkjet printing or nozzle printing.

The pixel defining layer 230 formed in the second dummy region DR2 may be used to test the breaking of the light emitting material of the light emitting layer 260 when the light emitting material is printed on the surface treatment layer 250 inside the opening 231 of the pixel defining layer 230 in each of the second dummy pixels DP2 by a printing method such as nozzle printing. Since the surface treatment layer 250 is formed on the first electrode 220 by a photolithography process, some of the surface treatment layer 250 may remain on a top surface of the pixel defining layer 230 if, for example, an exposure defect occurs. Therefore, the quality of the surface treatment layer 250 may be evaluated by testing the breaking of the light emitting material on the top surface of the pixel defining layer 230. If the breaking of the light emitting material is good, it means that a part of the surface treatment layer 250 does not remain on the top of the pixel defining layer 230 between a plurality of pixels so that a degree which the light emitting material is not printed on the top surface of the pixel defining layer 230 is high.

The pixel defining layer 230 in the second dummy region DR2 is formed such that the gap between the second dummy pixels DP2 varies, that is, gradually increases in the order of d1, d2, d3 and d4 but is equal to or smaller than the gap d between the active pixels AP. The pixel defining layer 230 formed in this way makes it possible not only to determine whether the breaking of the light emitting material of the light emitting layer 260 is good or bad when the light emitting material is printed on the surface treatment layer 250 formed in each of the second dummy pixels DP2 but to also quantitatively evaluate the degree of breaking of the light emitting material in the second dummy region DR2. The quantitative evaluation of the breaking of the light emitting material may refer to evaluating the number of portions of the pixel defining layer 230 on which the light emitting material is printed from among a plurality of portions of the pixel defining layer 230 which correspond to the gaps d1 through d4 between the second dummy pixels DP2.

More specifically, in the quantitative evaluation of the breaking of the light emitting material, it is evaluated whether the number of portions of the pixel defining layer 230 on which the light emitting material is printed from among the portions of the pixel defining layer 230 which correspond to the gaps d1 through d4 between the second dummy pixels DP2 is equal to or less than a reference number. The reference number may be determined to be, for example, two in view of the portions of the pixel defining layer 230 which correspond to the four gaps d1 through d4.

In the quantitative evaluation of the breaking of the light emitting material, if the number of portions of the pixel defining layer 230 on which the light emitting material is printed is equal to or less than the reference number, it is determined that the surface treatment layer 250 formed in each of the active pixels AP is not defective. In this case, a process of forming the light emitting layer 260 on the surface treatment layer 250 in each of the active pixels AP may be performed as part of the process of fabricating the light emitting display device 200. On the other hand, if the number of portions of the pixel defining layer 230 on which the light emitting material is printed is greater than the reference number, it is determined that the surface treatment layer 250 formed in each of the active pixels AP is defective. In this case, the process of fabricating the light emitting display device 200 may be stopped, and the substrate 210 having the evaluated surface treatment layer 250 may be discarded.

The light emitting layer 260, like the light emitting layer 160 of FIG. 2, is formed on the surface treatment layer 250.

The second electrode 270, like the second electrode 170 of FIG. 2, is formed on the light emitting layer 260 in each of the active pixels AP.

As described above, in the light emitting display device 200 according to one embodiment, the surface treatment layer 250 having a plurality of grooves is formed in each of the first dummy pixels DP1. Therefore, when the light emitting material of the light emitting layer 260 is printed on the surface treatment layer 250 inside the opening 231 of the pixel defining layer 230 by a printing method such as inkjet printing or nozzle printing during the process of fabricating the light emitting display device 200, the wettability of the light emitting material can be quantitatively evaluated.

Hence, in the light emitting display device 200 according to one embodiment, the quality of the surface treatment layer 250 in the active region AP can be monitored reliably by quantitatively evaluating the wettability of the light emitting material through the surface treatment layer 250 formed in each of the first dummy pixels DP1.

Furthermore, in the light emitting display device 200 according to one embodiment, the pixel defining layer 230 is formed such that the gap between the second dummy pixels DP2 in the second dummy region DR2 gradually increases in the order of d1, d2, d3 and d4 but is equal to or smaller than the gap d between the active pixels AP. Therefore, when the light emitting material of the light emitting layer 260 is printed on the surface treatment layer 250 inside the opening 231 of the pixel defining layer 230 by a printing method such as nozzle printing, the breaking of the light emitting material can be quantitatively evaluated.

Hence, in the light emitting display device 200 according to one embodiment, the quality of the surface treatment layer 250 in the active region AP can be monitored reliably by quantitatively evaluating the breaking of the light emitting material through the pixel defining layer 230 formed in the second dummy region DR2.

A light emitting display device according to another embodiment of the present invention will now be described.

Figure 12:
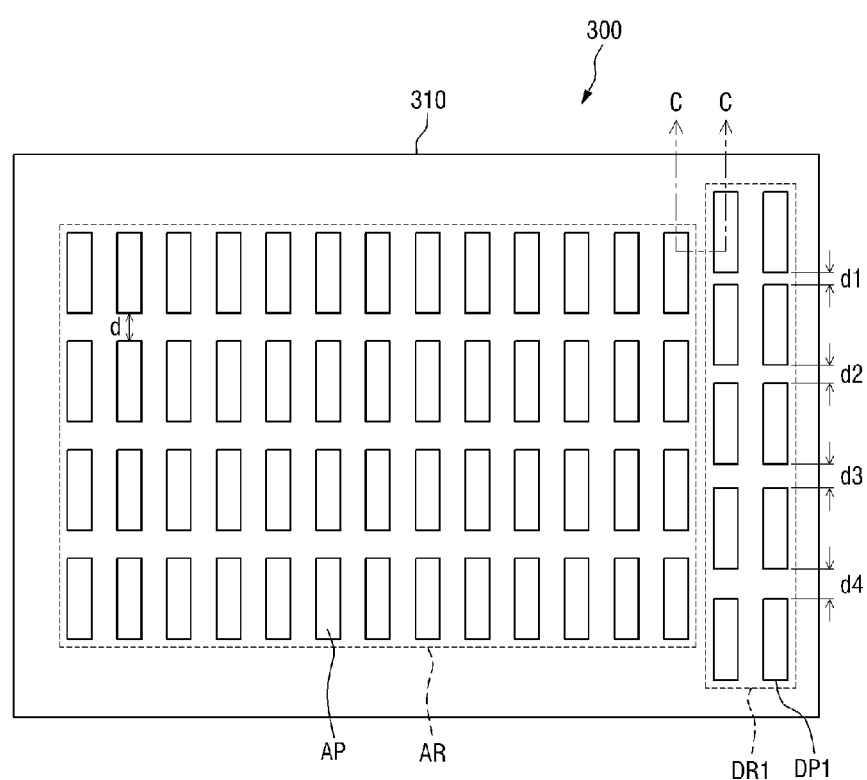
FIG. 12 is a schematic plan view of an active region and a first dummy region of a light emitting display device according to another embodiment of the present invention.
Figure 13:
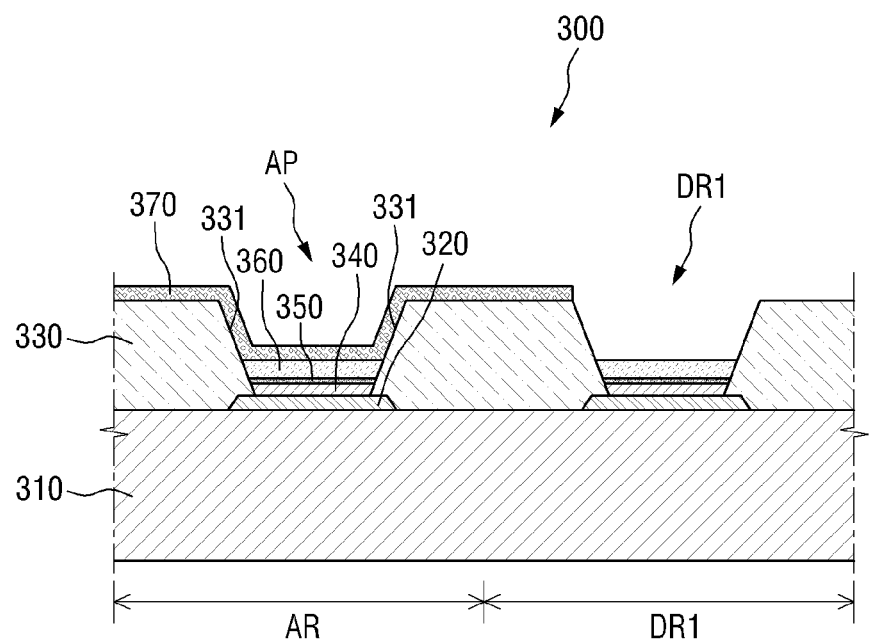
FIG. 13 is a cross-sectional view of the light emitting display device taken along line C-C of FIG. 12.

FIG. 12 is a schematic plan view of an active region and a first dummy region of a light emitting display device according to another embodiment of the present invention. FIG. 13 is a cross-sectional view of the light emitting display device taken along line C-C of FIG. 12.

Referring to FIGS. 12 and 13, the light emitting display device 300 according to one embodiment includes a substrate 310, a first electrode 320, a pixel defining layer 330, a surface treatment layer 350, a light emitting layer 360, and a second electrode 370.

The substrate 310, like the substrate 110 of FIGS. 1 and 2, includes the active region AR and the first dummy region DP1 disposed outside the active region AR. A plurality of active pixels AP for displaying images are formed in the active region AR, and a plurality of first dummy pixels DP1 are formed in the first dummy region DR1. However, a gap between the first dummy pixels DP1 in the first dummy region DP1 of the substrate 310 may gradually increase in the order of d1, d2, d3 and d4 and may be equal to or smaller than a gap d between the active pixels AP.

The first electrode 320 is similar to the first electrode 120 of FIG. 2.

The pixel defining layer 330 is similar to the pixel defining layer 130 of FIG. 2. However, the pixel defining layer 330 may be formed such that the gap between the first dummy pixels DP1 gradually increases in the order of d1, d2, d3 and d4 but is equal to or smaller than the gap d between the active pixels AP.

The light emitting display device 300 according to one embodiment may include a hole injection layer 340 which is, like the hole injection layer 140 of FIG. 2, formed on the first electrode 320 exposed through an opening 331 of the pixel defining layer 330.

The surface treatment layer 350 is similar to the surface treatment layer 150 of FIG. 2 and is formed to have a plurality of grooves in each of the first dummy pixels DP1. In each of the active pixels AP, the surface treatment layer 350 may have the same planar shape as the opening 331 of the pixel defining layer 330. However, the surface treatment layer 350 may have a plurality of grooves. The grooves g1 through g7 shown in FIGS. 3 through 9 may be employed as the grooves of the surface treatment layer 350 formed in each of the first dummy pixels DP1.

The surface treatment layer 350 formed in the first dummy region DP1 may be used to test the wettability of the light emitting material of the light emitting layer 360 when the light emitting material is printed on the surface treatment layer 350 inside the opening 331 of the pixel defining layer 330 in each of the first dummy pixels DP1 by a printing method such as nozzle printing.

The pixel defining layer 330 formed in the first dummy region DP1 may be used to test the breaking of the light emitting material of the light emitting layer 360 when the light emitting material is printed on the surface treatment layer 350 inside the opening 331 of the pixel defining layer 330 in each of the first dummy pixels DP1 by a printing method such as nozzle printing.

The light emitting layer 360, like the light emitting layer 160 of FIG. 2, is formed on the surface treatment layer 350.

The second electrode 370, like the second electrode 170 of FIG. 2, is formed on the light emitting layer 360 in each of the active pixels AP.

As described above, in the light emitting display device 300 according to one embodiment, the surface treatment layer 350 having a plurality of grooves is formed in each of the first dummy pixels DP1, and the pixel defining layer 330 is formed such that the gap between the first dummy pixels DP1 in the first dummy region DP1 gradually increases in the order of d1, d2, d3 and d4 but is equal to or smaller than the gap d between the active pixels AP. Therefore, when the light emitting material of the light emitting layer 360 is printed on the surface treatment layer 350 inside the opening 331 of the pixel defining layer 330 by a printing method such as nozzle printing during a process of fabricating the light emitting display device 300, the wettability and breaking of the light emitting material can be quantitatively evaluated.

Hence, in the light emitting display device 300 according to one embodiment, the quality of the surface treatment layer 350 in the active region AP can be monitored reliably.

A method of fabricating a light emitting display device according to an embodiment of the present invention will now be described.

Figure 14:
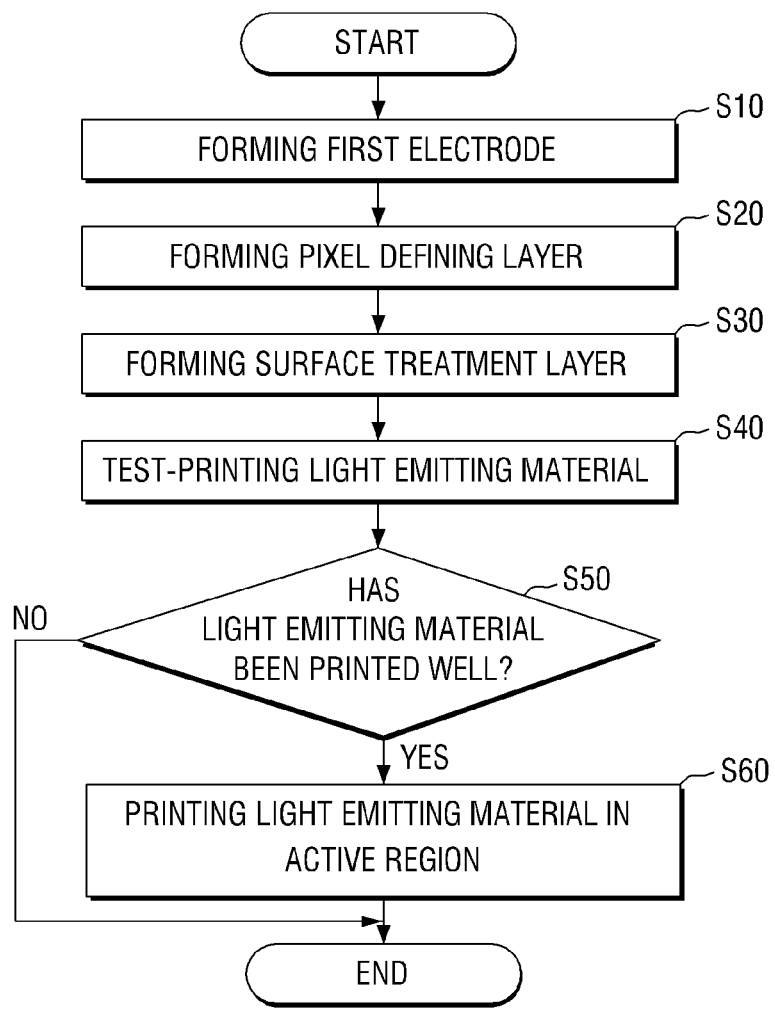
FIG. 14 is a flowchart illustrating a method of fabricating a light emitting display device according to an embodiment of the present invention.

FIG. 14 is a flowchart illustrating a method of fabricating a light emitting display device according to an embodiment of the present invention. FIGS. 15 through 20 are cross-sectional views illustrating the fabrication method of FIG. 14.

Referring to FIG. 14, the method of fabricating the light emitting display device 100 according to one embodiment may include forming a first electrode (operation S10), forming a pixel defining layer (operation S20), forming a surface treatment layer (operation S30), test-printing a light emitting material (operation S40), determining whether the light emitting material has been printed well (operation S50), and printing the light emitting material in an active region (operation S60).

Figure 15:
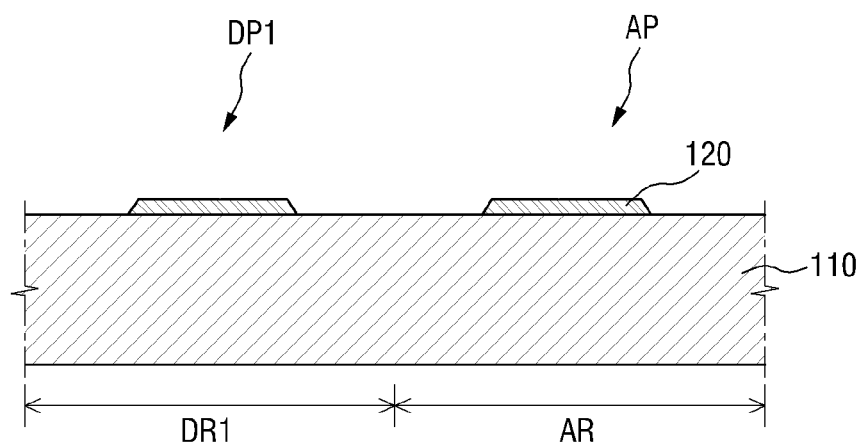
FIGS. 15 through 20 are cross-sectional views illustrating the fabrication method of FIG. 14.

Referring to FIG. 15, in the forming of the first electrode (operation S10), a first electrode 120 is formed on a substrate 110 in each pixel. The substrate 110 includes an active region AR in which a plurality of active pixels AP for displaying images are formed and a first dummy region DP1 which is disposed outside the active region AR and in which a plurality of first dummy pixels DP1 are formed. The first electrode 120 may be formed by depositing a transparent electrode material or a reflective material on the substrate 110 and patterning the transparent electrode material or the reflective material.

Figure 16:
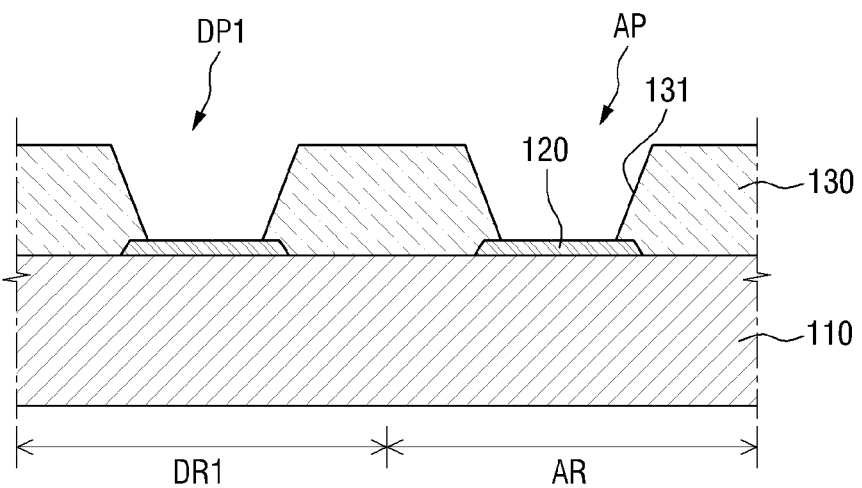

Referring to FIG. 16, in the forming of the pixel defining layer (operation S20), a pixel defining layer 130 which defines each pixel and has an aperture 131 that exposes the first electrode 120 is formed on the substrate 110. The pixel defining layer 130 may be formed by depositing an insulating material on the whole surface of the substrate 110 to cover the first electrode 120 by using a deposition method and then patterning the deposited insulating material.

Figure 17:
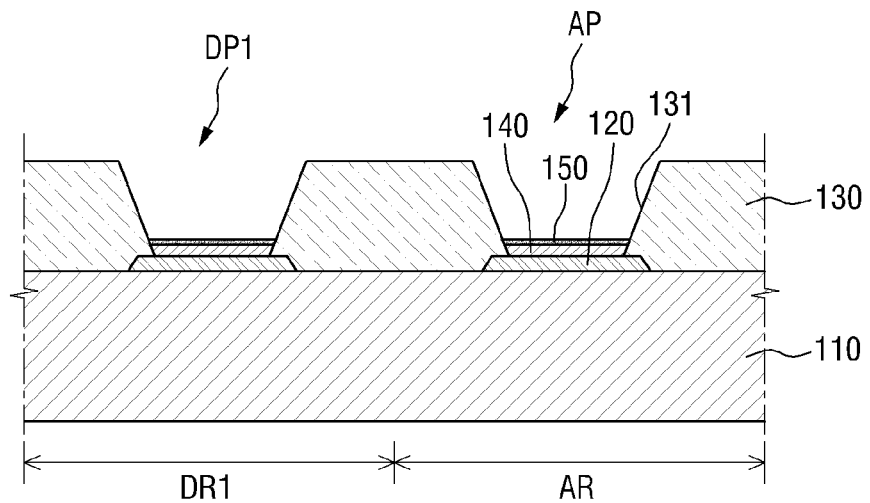

Referring to FIG. 17, in the forming of the surface treatment layer (operation S30), a surface treatment layer 150 having a plurality of grooves in each of the first dummy pixels DP1 is formed on the first electrode 120. The surface treatment layer 150 may be formed by depositing a lyophilic primer on the whole surface of the first electrode 120 and the pixel defining layer 130 by using a deposition method and then patterning the deposited primer by using a photolithography process such that the deposited primer remains on the first electrode 120. The grooves of the surface treatment layer 150 in each of the first dummy pixels DP1 have been described above, and thus a repetitive description thereof will be omitted. Before the formation of the surface treatment layer 150, a hole injection layer 140 may be formed on the first electrode 120 by, for example, slit coating.

Figure 18:
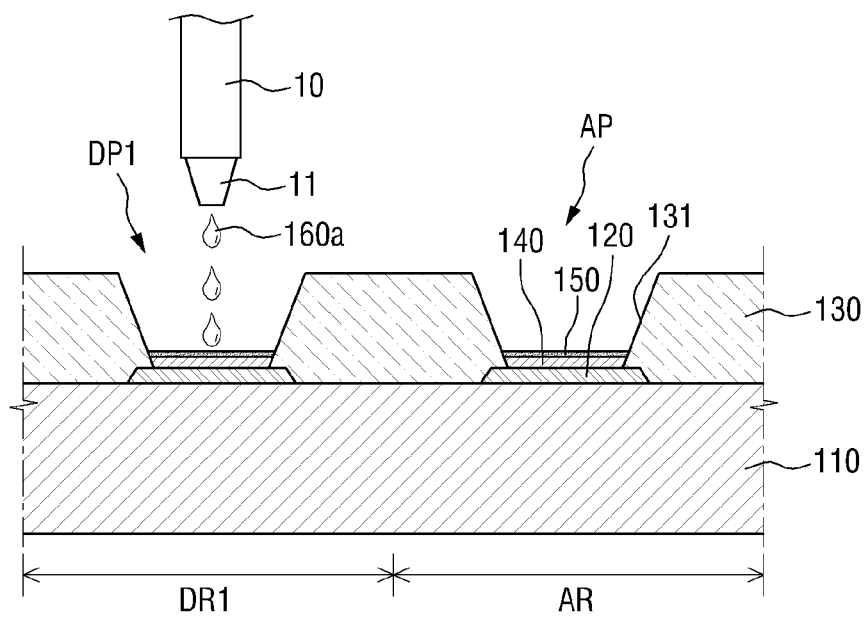

Referring to FIG. 18, in the test-printing of the light emitting material (operation S40), a light emitting material 160a is test-printed in each of the first dummy pixels DP1. Specifically, the light emitting material 160a is ejected onto the surface treatment layer 150 in each of the first dummy pixels DP1 by using an inkjet printing device 10 having a nozzle 11 in an inkjet printing method.

In the determining of whether the light emitting material has been printed well (operation S50), the wettability of the light emitting material 160a is quantitatively evaluated. Specifically, it is evaluated whether the area which the light emitting material 160a printed on the surface treatment layer 150 formed in each of the first dummy pixels DP1 occupies in each of the first dummy pixels DP1 is equal to or greater than a reference area value. The evaluation may be performed by, for example, a visual inspection device. Since details about the evaluation have been described above, a repetitive description thereof will be omitted.

Figure 19:
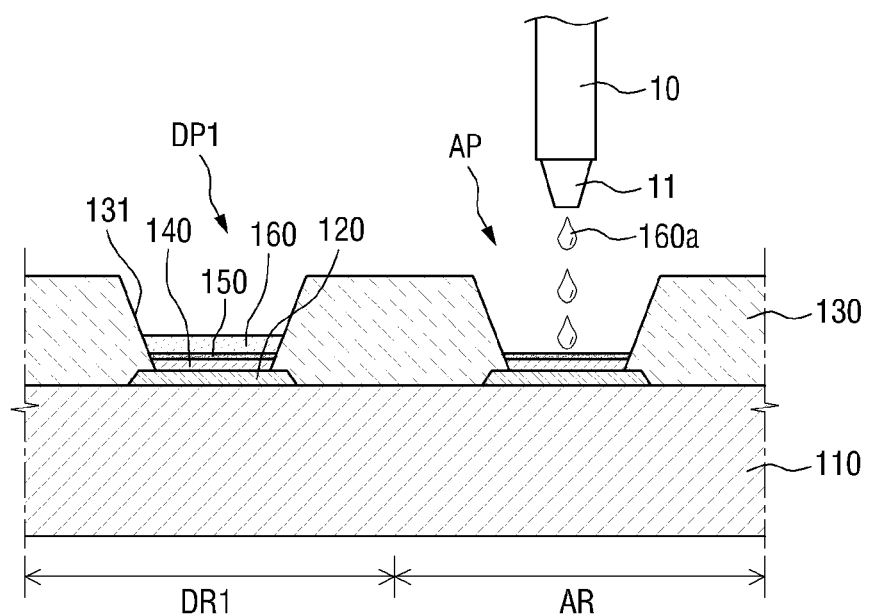
Figure 20:
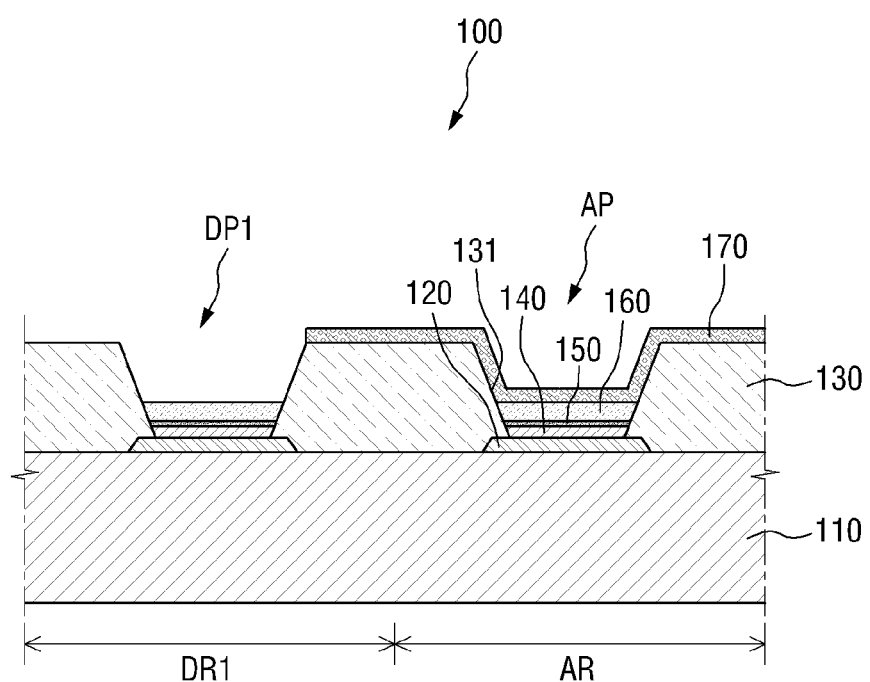

Referring to FIG. 19, in the printing of the light emitting material in the active region (operation S60), if the area which the light emitting material 160a printed on the surface treatment layer 150 formed in each of the first dummy pixels DP1 occupies in each of the first dummy pixels DP1 is equal to or greater than the reference area value, it is determined that the surface treatment layer 150 in each of the active pixels AP is not defective. In this case, the light emitting material 160a is printed on the surface treatment layer 150 in each of the active pixels AP. Specifically, the light emitting material 160a is ejected onto the surface treatment layer 150 in each of the active pixels AP by using the inkjet printing device 10 having the nozzle 11 in an inkjet printing process. Referring to FIG. 20, as the light emitting material 160a is printed on the surface treatment layer 150 of each of the active pixels AP, a light emitting layer 160 is formed. Then, a second electrode 170 is formed on the light emitting layer 160 in each of the active pixels AP.

In the determining of whether the light emitting material has been printed well (operation S50), if the area which the light emitting material 160a printed on the surface treatment layer 150 formed in each of the first dummy pixels DP1 occupies in each of the first dummy pixels DP1 is smaller than the reference area value, it is determined that the surface treatment layer 150 in each of the active pixels AP is defective. In this case, the process of fabricating the light emitting display device 100 is stopped, and the substrate 110 having the evaluated surface treatment layer 150 is discarded.

As described above, in the method of fabricating the light-emitting display device 100 according to one embodiment, if it is determined during the process of fabricating the light emitting display device 100 that the surface treatment layer 150 formed in each of the active pixels AP is not defective, the process of forming the light-emitting layer 160 on the surface treatment layer 150 in each of the active pixels AP is performed. However, if it is determined that the surface treatment layer 150 formed in each of the active pixels AP is defective, the process of fabricating the light emitting display device 100 is stopped, and the substrate 110 having the evaluated surface treatment layer 150 is discarded.

Therefore, the method of fabricating the light emitting display device 100 according to one embodiment can prevent unnecessary continuation of the process of fabricating the light emitting display device 100 in a case where a surface treatment layer formed in an active region of a substrate for a display device is defective even though the surface treatment layer was determined to be non-defective as a result of measuring a contact angle of a light emitting material on the surface treatment layer on another substrate.

A method of fabricating a light emitting display device according to another embodiment of the present invention will now be described.

Figure 21:
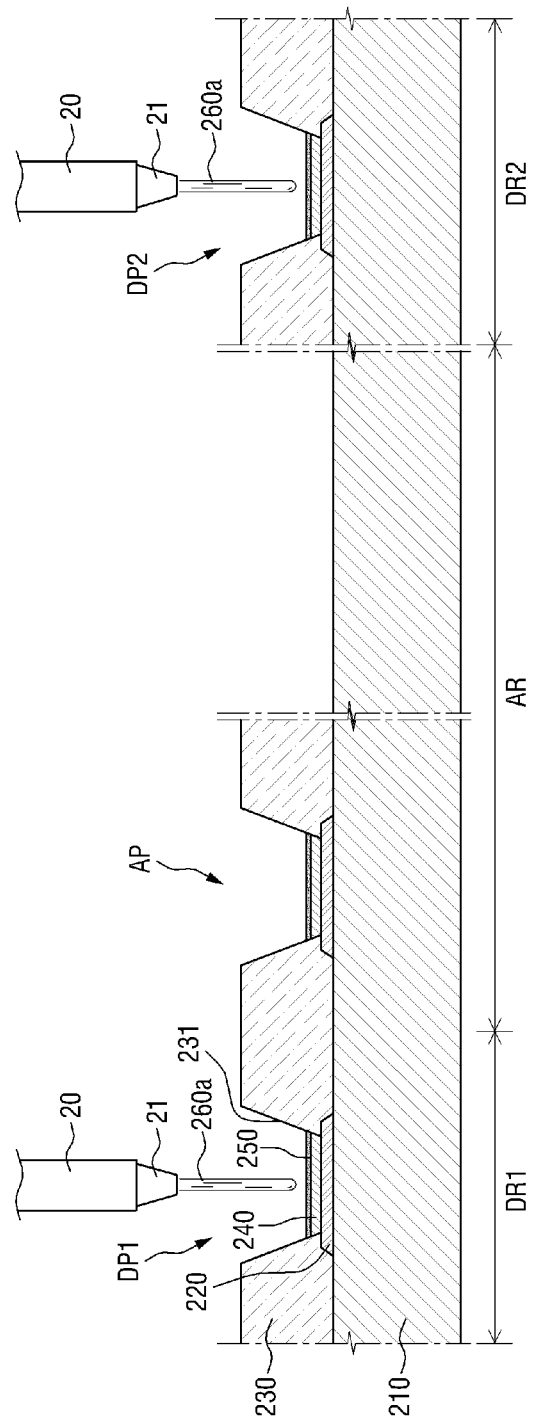
FIGS. 21 through 23 are cross-sectional views illustrating a method of fabricating a light emitting display device according to another embodiment of the present invention.
Figure 22:
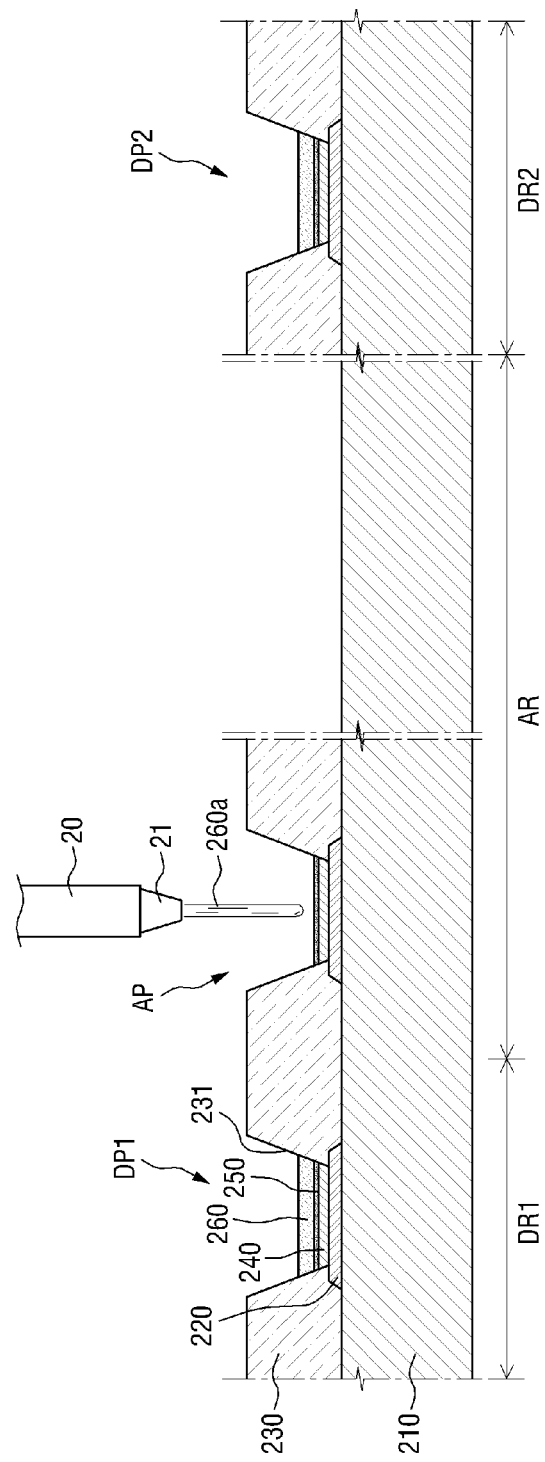
Figure 23:
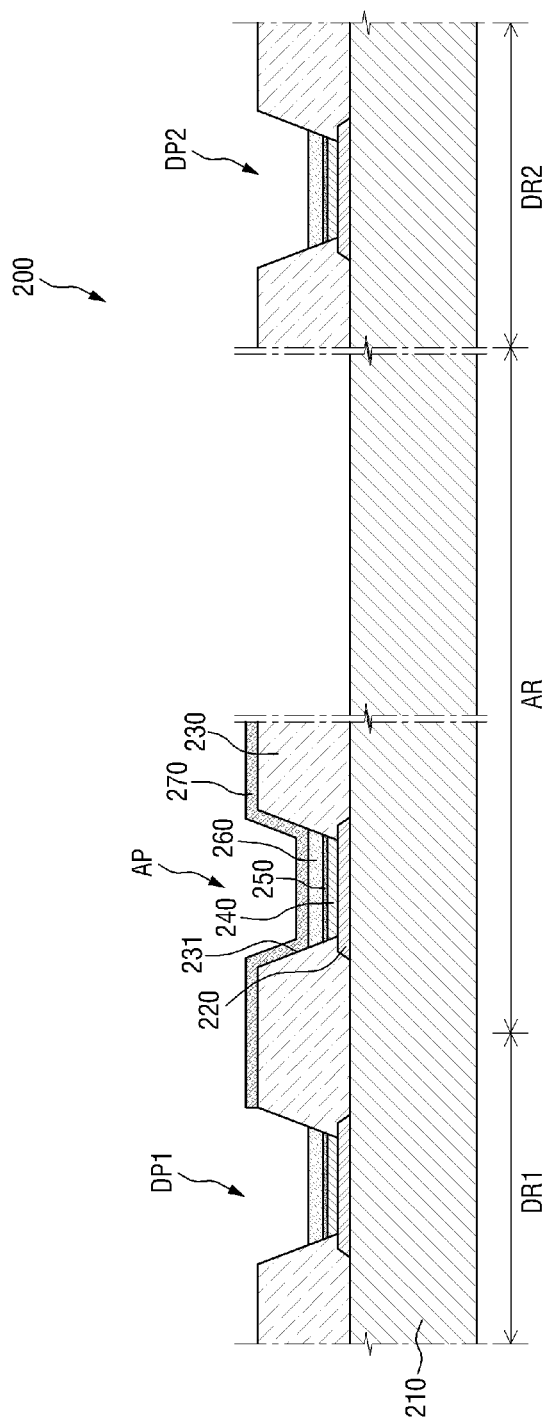

FIGS. 21 through 23 are cross-sectional views illustrating a method of fabricating a light emitting display device according to another embodiment of the present invention.

The method of fabricating the light emitting display device 200 according to one embodiment includes the same operations as those included in the flowchart of FIG. 14.

Referring to FIG. 21, in an operation of forming a first electrode, a first electrode 220 is formed on a substrate 210 in each pixel. The substrate 210 includes an active region AR in which a plurality of active pixels AP for displaying images are formed, a first dummy region DP1 which is disposed outside the active region AR and has a plurality of first dummy pixels DP1, and a second dummy region DR2 which is disposed outside the active region AR and has a plurality of second dummy pixels DP2. The first electrode 220 may be formed in the same way as the first electrode 120.

In an operation of forming a pixel defining layer, a pixel defining layer 230 which defines each pixel and has an aperture 231 that exposes the first electrode 220 is formed on the substrate 210. The pixel defining layer 230 may be formed in the same way as the pixel defining layer 130. However, the pixel defining layer 230 may be formed such that a gap d between the first dummy pixels DP1 is equal to a gap d between the active pixels AP in one direction and that a gap between the second dummy pixels DP2 gradually increases in the order of d1, d2, d3 and d4 but is equal to or smaller than the gap d between the active pixels AP in the one direction (see FIG. 10).

In an operation of forming a surface treatment layer, a surface treatment layer 250 having a plurality of grooves in each of the first dummy pixels DP1 is formed on the first electrode 220. The surface treatment layer 250 formed on the first electrode 220 in each of the active pixels AP and each of the second dummy pixels DP2 may have the same planar shape as the opening 231 of the pixel defining layer 230. However, the surface treatment layer 250 formed on the first electrode 220 in each of the first dummy pixels DP1 may have the same planar shape as the opening 231 of the pixel defining layer 230 but may have a plurality of grooves.

In an operation of test-printing a light emitting material, a light emitting material 260a is test-printed in each of the first dummy pixels DP1 and each of the second dummy pixels DP2. Specifically, the light emitting material 260a is ejected onto the surface treatment layer 250 in each of the first dummy pixels DP1 and each of the second dummy pixels DP2 by using an inkjet printing device 20 having a nozzle 21 in a nozzle printing process. Since nozzle printing is used as the printing method, the light emitting material 260a may flow in the form of a solution in one direction along a line including a top surface of the pixel defining layer 230 and the surface treatment layer 250. The one direction may be a direction in which the gap between the second dummy pixels DP2 gradually increases in the order of d1, d2, d3 and d4 (see FIG. 10).

In an operation of determining whether the light emitting material has been printed well, the wettability and breaking of the light emitting material 260a are quantitatively evaluated. Specifically, it is evaluated whether the area which the light emitting material 260a printed on the surface treatment layer 250 formed in each of the first dummy pixels DP1 occupies in each of the first dummy pixels DP1 is equal to or greater than a reference area value. In addition, it is evaluated whether the number of portions of the pixel defining layer 230 on which the light emitting material 260a is printed from among a plurality of portions of the pixel defining layer 230 which correspond to the gaps d1 through d4 between the second dummy pixels DP2 is equal to or less than a reference number. The evaluation may be performed by, for example, a visual inspection device. Since details about the evaluation have been described above, a repetitive description thereof will be omitted.

Referring to FIG. 22, in an operation of printing the light emitting material in an active region, if the area which the light emitting material 260a printed on the surface treatment layer 250 formed in each of the first dummy pixels DP1 occupies in each of the first dummy pixels DP1_is equal to or greater than the reference area value, and if the number of portions of the pixel defining layer 230 on which the light emitting material 260a is printed from among the portions of the pixel defining layer 230 which correspond to the gaps d1 through d4 between the second dummy pixels DP2 is equal to or less than the reference number, it is determined that the surface treatment layer 250 in each of the active pixels AP is not defective. In this case, the light emitting material 260a is printed on the surface treatment layer 250 in each of the active pixels AP. Specifically, the light emitting material 260a is ejected onto the surface treatment layer 250 in each of the active pixels AP by using the inkjet printing device 20 having the nozzle 21 in a nozzle printing process. Referring to FIG. 23, as the light emitting material 260a is printed on the surface treatment layer 250 of each of the active pixels AP, a light emitting layer 260 is formed. Then, a second electrode 270 is formed on the light emitting layer 260 in each of the active pixels AP.

If, alternatively, the area which the light emitting material 260a printed on the surface treatment layer 250 is smaller than the reference area value, or if the number of portions of the pixel defining layer 230 on which the light emitting material 260a is printed is greater than the reference number, it is determined that the surface treatment layer 250 in each of the active pixels AP is defective. In this case, the process of fabricating the light emitting display device 200 is stopped, and the substrate 210 having the evaluated surface treatment layer 250 is discarded.

As described above, in the method of fabricating the light-emitting display device 200 according to one embodiment, if it is determined during the process of fabricating the light emitting display device 200 that the surface treatment layer 250 formed in each of the active pixels AP is not defective, the process of forming the light-emitting layer 260 on the surface treatment layer 250 in each of the active pixels AP is performed. However, if it is determined that the surface treatment layer 250 formed in each of the active pixels AP is defective, the process of fabricating the light emitting display device 200 is stopped, and the substrate 210 having the evaluated surface treatment layer 250 is discarded.

Therefore, the method of fabricating the light emitting display device 200 according to one embodiment can prevent unnecessary continuation of the process of fabricating the light emitting display device 200 in a case where a surface treatment layer formed in an active region of a substrate for a display device is defective even though the surface treatment layer was determined to be non-defective as a result of measuring a contact angle of a light emitting material on the surface treatment layer on another substrate.

A method of fabricating a light emitting display device according to another embodiment of the present invention will now be described.

Figure 24:
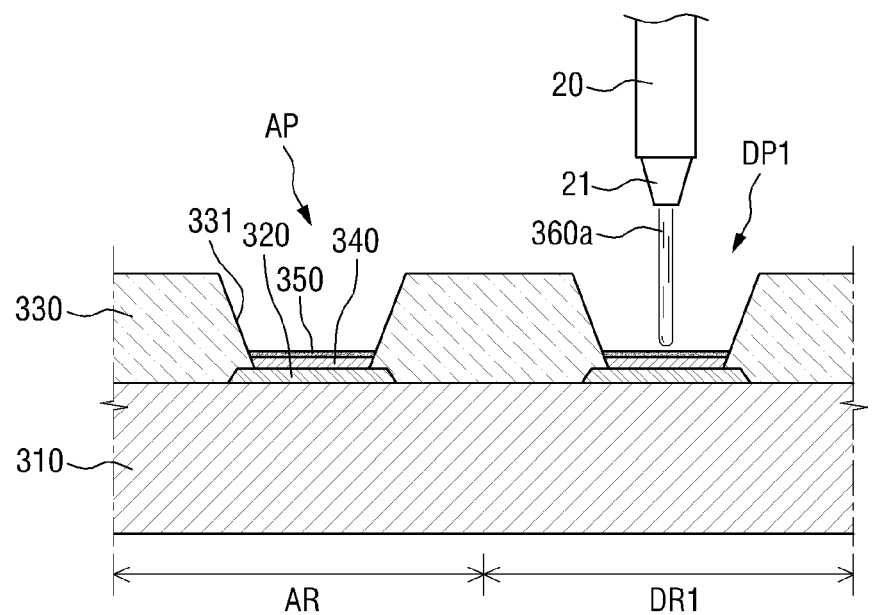
FIGS. 24 through 26 are cross-sectional views illustrating a method of fabricating a light emitting display device according to another embodiment of the present invention.
Figure 25:
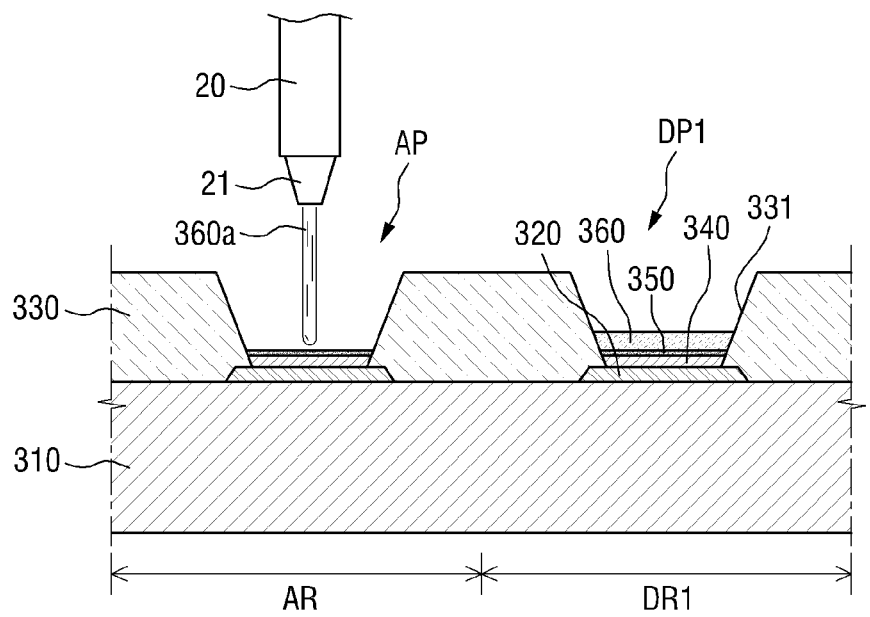
Figure 26:
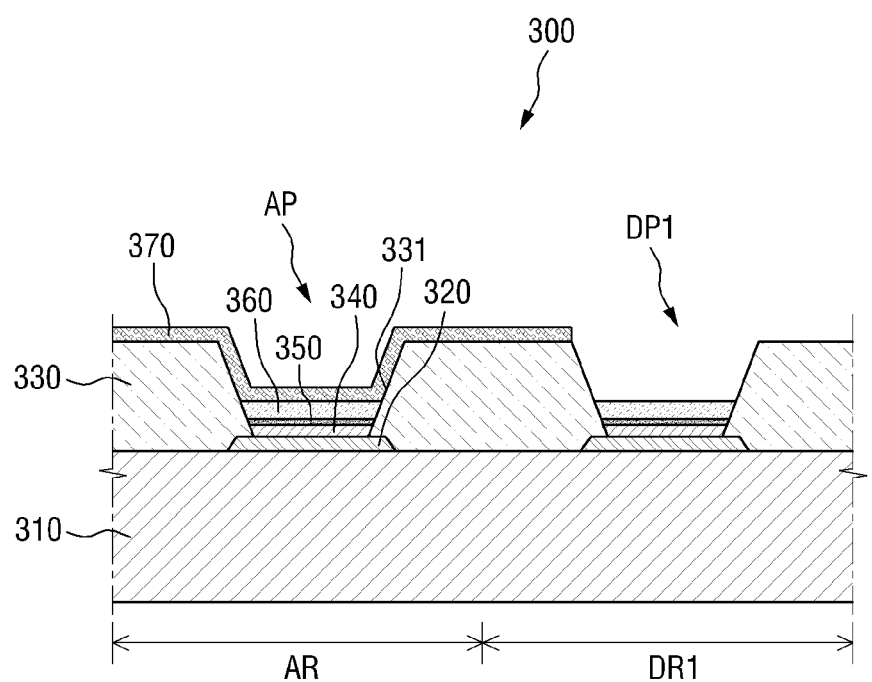

FIGS. 24 through 26 are cross-sectional views illustrating a method of fabricating a light emitting display device according to another embodiment of the present invention.

Referring to FIG. 24, in an operation of forming a first electrode, a first electrode 320 is formed on a substrate 310 in each pixel. The substrate 310 includes an active region AR in which a plurality of active pixels AP for displaying images are formed and a first dummy region DP1 which is disposed outside the active region AR and has a plurality of first dummy pixels DP1. The first electrode 320 may be formed in the same way as the first electrode 120.

In an operation of forming a pixel defining layer, a pixel defining layer 330 which defines each pixel and has an aperture 331 that exposes the first electrode 320 is formed on the substrate 310. The pixel defining layer 330 may be formed in the same way as the pixel defining layer 130. However, the pixel defining layer 330 may be formed such that, in one direction, a gap between the first dummy pixels DP1 gradually increases in the order of d1, d2, d3 and d4 but is equal to or smaller than a gap d between the active pixels AP (see FIG. 12).

In an operation of forming a surface treatment layer, a surface treatment layer 350 having a plurality of grooves in each of the first dummy pixels DP1 is formed on the first electrode 320. The surface treatment layer 350 formed on the first electrode 320 in each of the active pixels AP may have the same planar shape as the opening 331 of the pixel defining layer 330. However, the surface treatment layer 350 may also have a plurality of grooves.

In an operation of test-printing a light emitting material, a light emitting material 360a is test-printed in each of the first dummy pixels DP1. More specifically, the light emitting material 360a is ejected onto the surface treatment layer 350 in each of the first dummy pixels DP1 by using an inkjet printing device 20 having a nozzle 21 in a nozzle printing process.

In an operation of determining whether the light emitting material has been printed well, the wettability and breaking of the light emitting material 360a are quantitatively evaluated. More specifically, it is evaluated whether the area which the light emitting material 360a printed on the surface treatment layer 350 formed in each of the first dummy pixels DP1 occupies in each of the first dummy pixels DP1 is equal to or greater than a reference area value. In addition, it is evaluated whether the number of portions of the pixel defining layer 330 on which the light emitting material 360a is printed from among a plurality of portions of the pixel defining layer 330 which correspond to the gaps d1 through d4 between the first dummy pixels DP1 is equal to or less than a reference number. The evaluation may be performed by, for example a visual inspection device. Since details about the evaluation have been described above, a repetitive description thereof will be omitted.

Referring to FIG. 25, in an operation of printing the light emitting material in an active region, if the area which the light emitting material 360a printed on the surface treatment layer 350 formed in each of the first dummy pixels DP1 occupies in each of the first dummy pixels DP1 is equal to or greater than the reference area value, and if the number of portions of the pixel defining layer 330 on which the light emitting material 360a is printed from among the portions of the pixel defining layer 330 which correspond to the gaps d1 through d4 between the first dummy pixels DP1 is equal to or less than the reference number, it is determined that the surface treatment layer 350 in each of the active pixels AP is not defective. In this case, the light emitting material 360a is printed on the surface treatment layer 350 in each of the active pixels AP. Specifically, the light emitting material 360a is ejected onto the surface treatment layer 350 in each of the active pixels AP by using the inkjet printing device 20 having the nozzle 21 in a nozzle printing process. Referring to FIG. 26, as the light emitting material 360a is printed on the surface treatment layer 350 of each of the active pixels AP, a light emitting layer 360 is formed. Then, a second electrode 370 is formed on the light emitting layer 360 in each of the active pixels AP.

In the operation of determining whether the light emitting material has been printed well, if the area which the light emitting material 360a printed on the surface treatment layer 350 formed in each of the first dummy pixels DP1 occupies in each of the first dummy pixels DP1 is smaller than the reference area value, or if the number of portions of the pixel defining layer 330 on which the light emitting material 360a is printed from among the portions of the pixel defining layer 330 which correspond to the gaps d1 through d4 between the first dummy pixels DP1 is greater than the reference number, it is determined that the surface treatment layer 350 in each of the active pixels AP is defective. In this case, the process of fabricating the light emitting display device 300 is stopped, and the substrate 310 having the evaluated surface treatment layer 350 is discarded.

As described above, in the method of fabricating the light-emitting display device 300 according to one embodiment, if it is determined during the process of fabricating the light emitting display device 300 that the surface treatment layer 350 formed in each of the active pixels AP is not defective, the process of forming the light-emitting layer 360 on the surface treatment layer 350 in each of the active pixels AP is performed. However, if it is determined that the surface treatment layer 350 formed in each of the active pixels AP is defective, the process of fabricating the light emitting display device 300 is stopped, and the substrate 310 having the evaluated surface treatment layer 350 is discarded.

Therefore, the method of fabricating the light emitting display device 300 according to one embodiment can prevent unnecessary continuation of the process of fabricating the light emitting display device 300 in a case where a surface treatment layer formed in an active region of a substrate for a display device is defective even though the surface treatment layer was determined to be non-defective as a result of measuring a contact angle of a light emitting material on the surface treatment layer on another substrate.

Embodiments of the present invention provide at least one of the following advantages.

In a light emitting display device and a method of fabricating the same according to an embodiment of the present invention, the quality of a surface treatment layer can be monitored reliably by evaluating the wettability of a light emitting material on the surface treatment layer in a fabrication process.

In a light emitting display device and a method of fabricating the same according to another embodiment of the present invention, the quality of a surface treatment layer can be monitored reliably by evaluating the breaking of a light emitting material on a top surface of a pixel defining layer in a fabrication process.

However, the effects of the present invention are not restricted to the ones set forth herein. The above and other effects of the present invention will become more apparent to one of daily skill in the art to which the present invention pertains by referencing the claims.

Those skilled in the art will appreciate that many variations and modifications can be made to the embodiments without substantially departing from the principles of the present invention. Therefore, the disclosed embodiments of the invention are to be used in a generic and descriptive sense only, and not for purposes of limitation.

What is claimed is:

1. A light emitting display device comprising:
a substrate comprising:
an active region in which a plurality of active pixels is formed, and
a first dummy region disposed outside the active region in which a plurality of first dummy pixels is formed;
a first electrode formed on the substrate in each pixel;
a pixel defining layer defining each pixel and including an opening configured to expose the first electrode;
a surface treatment layer formed on the first electrode and including a plurality of grooves in each of the first dummy pixels;
a light emitting layer formed on the surface treatment layer; and
a second electrode formed on the light emitting layer in each of the active pixels.

2. The display device of claim 1, wherein a gap between the first dummy pixels is equal to a gap between the active pixels in one direction.

3. The display device of claim 2, wherein the surface treatment layer has the same planar shape as the opening of the pixel defining layer in each of the active pixels, and wherein the surface treatment layer has the same planar shape as the opening of the pixel defining layer and comprises a plurality of grooves at edges thereof in each of the first dummy pixels.

4. The display device of claim 1, wherein each of the plurality of grooves has any one planar shape selected from a polygon, a semi-circle, a semi-ellipse, or a combination of these shapes.

5. The display device of claim 1, wherein the substrate further comprises a second dummy region disposed outside the active region in which a plurality of second dummy pixels is formed, wherein the gap between the first dummy pixels is equal to the gap between the active pixels in one direction, and a gap between the second dummy pixels gradually increases and is equal to or smaller than the gap between the active pixels in the one direction.

6. The display device of claim 5, wherein the surface treatment layer has the same planar shape as the opening of the pixel defining layer in each of the active pixels and in each of the second dummy pixels, and wherein the surface treatment layer has the same planar shape as the opening of the pixel defining layer and comprises a plurality of grooves at the edges thereof in each of the first dummy pixels.

7. The display device of claim 1, wherein the gap between the first dummy pixels gradually increases and is equal to or smaller than the gap between the active pixels in one direction.

8. The display device of claim 7, wherein the surface treatment layer has the same planar shape as the opening of the pixel defining layer in each of the active pixels, and wherein the surface treatment layer has the same planar shape as the opening of the pixel defining layer has and comprises a plurality of grooves at the edges thereof in each of the first dummy pixels.

9. A method of fabricating a light emitting display device, the method comprising:
forming a first electrode on a substrate in each pixel, wherein the substrate comprises an active region including a plurality of active pixels and a first dummy region disposed outside the active region and including a plurality of first dummy pixels;
forming a pixel defining layer on the substrate the pixel defining layer comprising an opening exposing the first electrode;

forming a surface treatment layer on the first electrode the surface treatment layer including a plurality of grooves in each of the first dummy pixels; and test-printing a light emitting material by ejecting the light emitting material onto the surface treatment layer in each of the first dummy pixels.

10. The method of claim 9, wherein the pixel defining layer is formed such that a gap between the first dummy pixels is equal to a gap between the active pixels in one direction.

11. The method of claim 10, wherein the surface treatment layer is formed to have a same planar shape as the opening of the pixel defining layer in each of the active pixels, and wherein the surface treatment layer is formed to have a same planar shape as the opening of the pixel defining layer and a plurality of grooves at edges thereof in each of the first dummy pixels.

12. The method of claim 9, wherein forming the surface treatment layer comprises forming the grooves to have a planar shape selected from a polygon, a semi-circle, a semi-ellipse, or a combination of these shapes.

13. The method of claim 10, wherein the test-printing of the light emitting material is performed using an inkjet printing method and further comprises:

determining that the area which the light emitting material printed on the surface treatment layer formed in each of the first dummy pixels occupies in each of the first dummy pixels is equal to or greater than a reference area value; and printing the light emitting material on the surface treatment layer in each of the active pixels of the active region.

14. The method of claim 9, wherein the first electrode is formed on the substrate in each pixel, wherein the substrate further comprises a second dummy region disposed outside the active region and in which a plurality of second dummy pixels is formed.

15. The method of claim 14, wherein the pixel defining layer is formed such that the gap between the first dummy pixels is equal to the gap between the active pixels in one direction and such that a gap between the second dummy pixels gradually increases and is equal to or smaller than the gap between the active pixels in the one direction.

16. The method of claim 15, wherein the surface treatment layer is formed to have a same planar shape as the opening of the pixel defining layer in each of the active pixels and in each of the second dummy pixels, and wherein the surface treatment layer is formed to have a same planar shape as the opening of the pixel defining layer and a plurality of grooves at the edges thereof in each of the first dummy pixels.

17. The method of claim 16, wherein the test-printing the light emitting material is performed by ejecting the light emitting material onto the surface treatment layer in each of the first dummy pixels and each of the second dummy pixels by using a nozzle printing method and further comprises:

determining that an area which the light emitting material printed on the surface treatment layer formed in each of the first dummy pixels occupies in each of the first dummy pixels is equal to or greater than a reference area value;

determining that a number of portions of the pixel defining layer on which the light emitting material is printed from among a plurality of portions of the pixel defining layer which correspond to the gaps between the second dummy pixels is equal to or less than a reference number; and printing the light emitting material on the surface treatment layer in each of the active pixels of the active region.

18. The method of claim 9, wherein the pixel defining layer is formed such that a gap between the first dummy pixels gradually increases and is equal to or smaller than a gap between the active pixels in one direction.

19. The method of claim 18, wherein the surface treatment layer is formed to have a same planar shape as the opening of the pixel defining layer in each of the active pixels, and wherein the surface treatment layer is formed to have a same planar shape as the opening of the pixel defining layer and a plurality of grooves at the edges thereof in each of the first dummy pixels.

20. The method of claim 19, wherein test-printing of the light emitting material is performed using the nozzle printing method and further comprises:

determining that an area which the light emitting material printed on the surface treatment layer formed in each of the first dummy pixels occupies in each of the first dummy pixels is equal to or greater than a reference area value;

determining that a number of portions of the pixel defining layer on which the light emitting material is printed from among a plurality of portions of the pixel defining layer which correspond to the gaps between the first dummy pixels is equal to or less than a reference number; and printing the light emitting material on the surface treatment layer in each of the active pixels of the active region.

* * * * *